US008670736B2

United States Patent
Ye

(10) Patent No.: US 8,670,736 B2
(45) Date of Patent: Mar. 11, 2014

(54) CRYSTAL CONTROL SCHEME TO IMPROVE PERFORMANCE OF A RECEIVER

(75) Inventor: Sheng Ye, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 136 days.

(21) Appl. No.: 12/944,679

(22) Filed: Nov. 11, 2010

(65) Prior Publication Data

US 2011/0281542 A1    Nov. 17, 2011

Related U.S. Application Data

(60) Provisional application No. 61/260,322, filed on Nov. 11, 2009.

(51) Int. Cl.
*H04B 1/06* (2006.01)

(52) U.S. Cl.
USPC .......... 455/255; 455/130; 455/134; 455/147; 455/15.1; 331/2; 331/46; 331/57

(58) Field of Classification Search
USPC ........ 455/130, 134, 147, 165.1, 180.3, 183.1, 455/209, 226.1, 255, 259, 260, 264, 265; 331/2, 46, 57
See application file for complete search history.

(56) References Cited

U.S. PATENT DOCUMENTS

| | | | |
|---|---|---|---|
| 5,422,911 A | 6/1995 | Barrett, Jr. et al. | |
| 2003/0060176 A1 | 3/2003 | Heinonen et al. | |
| 2004/0077324 A1 | 4/2004 | Wieck | |
| 2005/0114023 A1 | 5/2005 | Williamson et al. | |
| 2006/0109939 A1 | 5/2006 | Ciccarelli et al. | |
| 2008/0013654 A1 | 1/2008 | Rick et al. | |
| 2008/0014894 A1 | 1/2008 | Manku et al. | |
| 2009/0115658 A1 | 5/2009 | Zimmerman et al. | |
| 2010/0273442 A1 | 10/2010 | Zeng | |
| 2011/0053537 A1* | 3/2011 | Nagaraj et al. | 455/208 |
| 2011/0280344 A1 | 11/2011 | Ye et al. | |

OTHER PUBLICATIONS

International Search Report and Written Opinion corresponding to the PCT application No. PCT/US10/56422, date of mailing Jan. 12, 2011, 8 pages total.

International Preliminary Report on Patentability with Written Opinion for PCT Application No. PCT/US2010/056422, mailed May 24, 2012; 7 pages.

International Search Report and Written Opinion for PCT Application No. PCT/US2010/056418, mailed on Jan. 12, 2011, 12 pages.

(Continued)

*Primary Examiner* — Tuan Pham

(74) *Attorney, Agent, or Firm* — Ardeshir Tabibi, Esq.; Kilpatrick Townsend & Stockton LLP

(57) ABSTRACT

A circuit includes, in part, a receiver, a received signal strength indicator (RSSI), and an oscillator. The receiver receives an incoming signal and an oscillating signal. The RSSI is responsive to the receiver and generates an output signal representative of the strength of the incoming signal. The oscillator receives different biasing conditions in response to different outputs of the RSSI. The oscillator generates the oscillating signal received by the receiver. The oscillator receives a first biasing condition when the incoming signal is detected as having a strength lower than or equal to a predetermined threshold value and a second biasing condition when the incoming signal is detected as having a strength higher than the predetermined threshold value. The first biasing condition may be defined by a first current, and the second biasing condition may be defined by a sum of the first current and a second current.

14 Claims, 1 Drawing Sheet

(56) References Cited

OTHER PUBLICATIONS

International Preliminary Report on Patentability with Written Opinion for PCT Application No. PCT/US2010/056418, mailed on May 24, 2012, 7 pages.

Non-Final Office Action for U.S. Appl. No. 12/944,521, mailed on Oct. 3, 2012, 9 pages.

Notice of Allowance for U.S. Appl. No. 12/944,521 mailed on Apr. 15, 2013, 6 pages.

* cited by examiner

CRYSTAL CONTROL SCHEME TO IMPROVE PERFORMANCE OF A RECEIVER

CROSS-REFERENCES TO RELATED APPLICATIONS

The present application claims benefit under 35 USC 119(e) of U.S. provisional application No. 61/260,322, filed Nov. 11, 2009, entitled "Crystal Control Scheme To Improve Performance Of A Receiver," the content of which is incorporated herein by reference in its entirety.

BACKGROUND OF THE INVENTION

The present invention relates to communication systems, and more particularly to minimizing the spur in such systems.

In conventional systems, controlling the spur of a crystal oscillator is achieved through careful floor-planning or by ensuring that the crystal oscillator is spaced away from other circuits whose performance can be adversely affected by the crystal oscillator.

BRIEF SUMMARY OF THE INVENTION

A circuit, in accordance with one embodiment of the present invention, includes, in part, a receiver, a received signal strength indicator, and an oscillator. The receiver is adapted to receive an incoming signal and an oscillating signal. The received signal strength indicator (RSSI) is responsive to the receiver and generates an output signal representative of the strength of the incoming signal. The oscillator is adapted to receive different biasing conditions in response to the output signal of the RSSI. The oscillator generates the oscillating signal received by the receiver.

In one embodiment, the oscillator receives a first biasing condition when the incoming signal is detected as having a strength lower than or equal to a predetermined threshold value and a second biasing condition when the incoming signal is detected as having a strength higher than the predetermined threshold value. In one embodiment, the first biasing condition is defined by a first current, and the second biasing condition is defined by a sum of the first current and a second current.

In one embodiment, the output signal of the RSSI is in a first state when the incoming signal is detected as having a strength higher than a predetermined threshold value and a second state when the incoming signal is detected as having a strength equal to or less than the predetermined threshold value. In one embodiment, the circuit further includes, in part, a control loop adapted to supply a reference clock signal to the oscillator in response to the output signal of the RSSI. In one embodiment, the control loop is selected from a group consisting of a phased-locked loop, a delay-locked loop, and a frequency-locked loop. In one embodiment, the circuit is a wireless receiving circuit. In one embodiment, the oscillator is a crystal oscillator.

A method of controlling the biasing condition of an oscillator, in accordance with one embodiment of the present invention, includes, in part, receiving an incoming signal and an oscillating signal, generating an output signal representative of a strength of the incoming signal, and varying the biasing condition applied to an oscillator in response to an output signal of the RSSI. The oscillator generates the oscillating signal.

In one embodiment, the method further includes, applying a first biasing condition when the incoming signal is detected as having a strength lower than or equal to a predetermined threshold strength, and applying a second biasing condition when the incoming signal is detected as having a strength higher than the predetermined threshold value. In one embodiment, the first biasing condition is defined by a first current, and the second biasing condition is defined by a sum of the first current and a second current.

In one embodiment, the method further includes placing the output signal in a first state when the incoming signal is detected as having a strength higher than the predetermined threshold value, and placing the output signal in a second state when the incoming signal is detected as having a strength equal to or less than the predetermined threshold value. In one embodiment, the method further includes using a control loop to supply a reference clock signal to the oscillator in response to the output signal. In one embodiment, the control loop may be a phased-locked loop, a delay-locked loop, or a frequency-locked loop. In one embodiment, the incoming signal is a wireless signal received via an antenna. In one embodiment, the oscillator is a crystal oscillator.

DETAILED DESCRIPTION OF THE INVENTION

Figure 1:
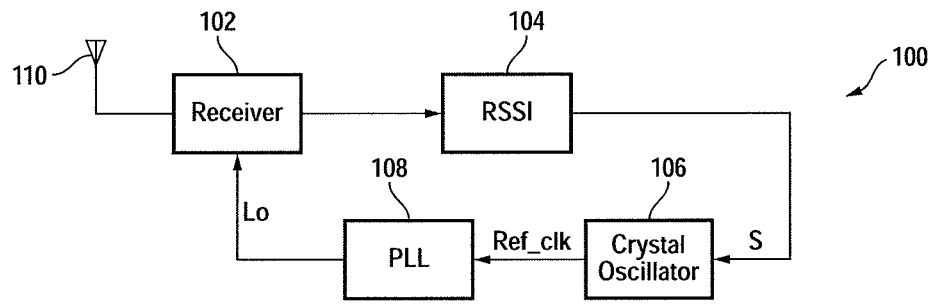
FIG. 1 is a block diagram of a receiving circuit adapted to dynamically control the biasing condition of a crystal oscillator disposed therein, in accordance with one exemplary embodiment of the present invention.

FIG. 1 is a block diagram of a receiving circuit 100 adapted to dynamically control the biasing condition of the crystal oscillator disposed therein, in accordance with one exemplary embodiment of the present invention. Receiving circuit 100 is shown as including, in part, a receiver 102, a received signal strength indicator (RSSI) 104, a crystal oscillator 106, and a phase-locked loop 108. Receiver 102 receives incoming (desired) signals via antenna 110. Following embodiments of the present invention are described with respect to a wireless receiver. It is understood, however, that receiver 102 may be any receiver, wireless or otherwise, that is sensitive to spurs. Furthermore, embodiments of the present invention are applicable to any other circuit, receiving circuit or otherwise, that receives a clock signal from a crystal oscillator.

Figure 2:
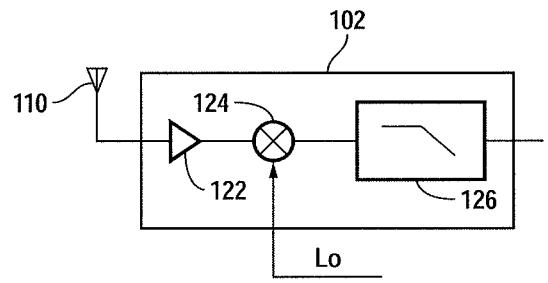
FIG. 2 shows a number of blocks of the receiver of FIG. 1, in accordance with one exemplary embodiment of the present invention.

FIG. 2 shows a number of blocks of receiver 102. Receiver 102 is shown as including, in part, a low-noise amplifier 122, a mixer 124, and a low-pass filter 126. Low-noise amplifier (LNA) 122 amplifies the incoming signal it receives from antenna 110 and supplies the amplified signal to mixer 124. Mixer 124 is adapted to convert the frequency of the signal it receives from LNA 122. Low-pass filter 126 is adapted to filter out undesired signals that may be present in the output signal of mixer 124.

Referring to FIGS. 1 and 2 concurrently, phase-locked loop 108 supplies the local oscillating LO signal to mixer 124 in response to the reference clock signal Ref_Clk that phase-locked loop 108 receives from crystal oscillator 106. In some embodiment, phase-locked loop 108 may be disposed in receiver 102. Furthermore, in other embodiments, any other control loop, such as a delay-locked loop, frequency-locked loop, or the like, may be used in place of the phase-locked loop.

During operation, RSSI 104 monitors the strength of the desired incoming signal supplied by receiver 102. If the signal supplied by receiver 102 has a strength smaller than or equal to a predefined threshold value, the output signal S of RSSI 104 is set to a first logic level (e.g., low logic level). Conversely, if the signal supplied by receiver 102 has a strength greater than a predefined threshold value, the output signal S of RSSI 104 is set to a second, complementary logic level (e.g., high logic level). Signal S is a feedback signal that is used to control the biasing condition of crystal oscillator 106, as described further below.

When the received incoming signal is weak, the receiver is more sensitive to spurs and to the harmonics of the LO signal. Accordingly, in response to the first logic level of signal S, i.e., in response to detecting that the output signal of the receiver has a strength lower than or equal to the predefined (predetermined) threshold value, the biasing applied to the crystal oscillator is decreased. Lowering the biasing applied to crystal oscillator 106, lowers the amplitude (the peak-to-peak swing) of the oscillating signal that crystal oscillator 106 generates, which, in turn, reduces the spurs to which the receiver is sensitive.

In response to the second logic level of signal S, i.e., in response to detecting that the output signal of the receiver has a strength higher than the predefined threshold value, the biasing applied to the crystal is increased. Increasing the biasing applied to crystal oscillator 106, increases the amplitude of the oscillating that signal crystal oscillator 106 generates, which, in turn, increases the signal-to-noise ratio.

Figure 3:
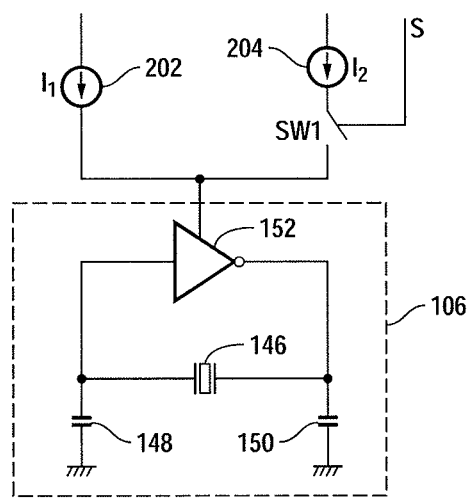
FIG. 3 is a simplified schematic diagram of the crystal oscillator of FIG. 1 and its biasing circuit, in accordance with one exemplary embodiment of the present invention.

FIG. 3 is a simplified schematic diagram of an exemplary embodiment of crystal oscillator 106 and current sources 202 ($I_1$) and 204 ($I_2$) used in biasing it, in accordance with one embodiment of the present invention. Crystal 146 is shown as being coupled to capacitors 148, 150, as well as to gain stage 152. Signal S generated by RSSI 104 (see FIG. 1) is shown as controlling the amount of current that is supplied to the crystal oscillator. When the incoming signal is detected as being weak, as described above, signal S is placed in the first logic state which causes switch SW1 to be open, thereby enabling only current level $I_1$ to be supplied to crystal oscillator 106. When the incoming signal is detected as being relatively strong, as described above, signal S is placed in the second logic state which causes switch SW1 to be closed, thereby enabling current $I_2$ in addition to current $I_1$ to be supplied to crystal oscillator 106.

The above embodiments of the present invention are illustrative and not limitative. Various alternatives and equivalents are possible. Other additions, subtractions or modifications are obvious in view of the present invention and are intended to fall within the scope of the appended claims.

What is claimed is:

1. A circuit comprising:
   a receiver receiving an incoming signal and an oscillating signal;
   a received signal strength indicator (RSSI) responsive to the receiver and adapted to generate an output signal representative of a strength of the incoming signal; and
   an oscillator adapted to receive different biasing conditions in response to different output signals of the RSSI, said oscillator generating the oscillating signal, wherein a first biasing condition is defined by a first current, and wherein a second biasing condition is defined by a sum of the first current and a second current.

2. The circuit of claim 1 wherein the oscillator receives the first biasing condition when the incoming signal is detected as having a strength lower than or equal to a predetermined threshold value and the second biasing condition when the incoming signal is detected as having a strength higher than the predetermined threshold value.

3. The circuit of claim 1 wherein the output signal of the RSSI is in a first state when the incoming signal is detected as having a strength higher than a predetermined threshold value and a second state when the incoming signal is detected as having a strength equal to or less than the predetermined threshold value.

4. The circuit of claim 1 wherein the circuit further comprises a control loop adapted to supply a reference clock signal to the oscillator in response to the output signal of the RSSI.

5. The circuit of claim 4 wherein said control loop is selected from a group consisting of a phased-locked loop, a delay-locked loop, and a frequency-locked loop.

6. The circuit of claim 4 wherein said circuit is a wireless receiving circuit.

7. The circuit of claim 6 wherein said oscillator is a crystal oscillator.

8. A method of controlling a biasing condition of an oscillator, the method comprising:
   receiving an incoming signal and an oscillating signal;
   generating an output signal representative of a strength of the incoming signal; and
   varying the biasing condition applied to the oscillator in response to the output signal, said oscillator generating the oscillating signal, wherein a first biasing condition is defined by a first current, and wherein a second biasing condition is defined by a sum of the first current and a second current.

9. The method of claim 8 further comprising:
   applying the first biasing condition when the incoming signal is detected as having a strength lower than or equal to a predetermined threshold value; and
   applying the second biasing condition when the incoming signal is detected as having a strength higher than the predetermined threshold value.

10. The method of claim 8 further comprising:
    placing the output signal in a first state when the incoming signal is detected as having a strength higher than a predetermined threshold value; and
    placing the output signal in a second state when the incoming signal is detected as having a strength equal to or less than the predetermined threshold value.

11. The method of claim 8 further comprising:
    using a control loop to supply a reference clock signal to the oscillator in response to the output signal.

12. The method of claim 11 wherein said control loop is selected from a group consisting of a phased-locked loop, a delay-locked loop, and a frequency-locked loop.

13. The circuit of claim 11 wherein said incoming signal is a wireless signal received via an antenna.

14. The circuit of claim 13 wherein said oscillator is a crystal oscillator.

* * * * *